(12) United States Patent
Chen et al.

(10) Patent No.: US 12,120,941 B1
(45) Date of Patent: Oct. 15, 2024

(54) METHOD FOR PREPARING HIGH-RESOLUTION QUANTUM DOT (QD) PIXELATED LIGHT-EMITTING FILM

(71) Applicant: SOOCHOW UNIVERSITY, Suzhou (CN)

(72) Inventors: Yu Chen, Suzhou (CN); Chengzhao Luo, Suzhou (CN); Zhenwei Ren, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 0 days.

(21) Appl. No.: 18/626,038

(22) Filed: Apr. 3, 2024

Related U.S. Application Data

(63) Continuation of application No. PCT/CN2023/098825, filed on Jun. 7, 2023.

(30) Foreign Application Priority Data

May 17, 2023 (CN) .......................... 202310558024.8

(51) Int. Cl.
  *H10K 71/20* (2023.01)
  *H10K 71/12* (2023.01)
  *H10K 50/115* (2023.01)
  *H10K 50/15* (2023.01)
  *H10K 50/16* (2023.01)

(52) U.S. Cl.
  CPC .......... *H10K 71/233* (2023.02); *H10K 71/12* (2023.02); *H10K 50/115* (2023.02); *H10K 50/15* (2023.02); *H10K 50/16* (2023.02)

(58) Field of Classification Search
  None
  See application file for complete search history.

(56) References Cited

U.S. PATENT DOCUMENTS

| | | | |
|---|---|---|---|
| 2016/0351842 A1* | 12/2016 | Park | H10K 71/20 |
| 2017/0176863 A1* | 6/2017 | Zhang | G03F 7/405 |
| 2017/0256754 A1* | 9/2017 | Defranco | H10K 50/15 |
| 2024/0032320 A1* | 1/2024 | Asaoka | H10K 71/60 |

FOREIGN PATENT DOCUMENTS

| | | |
|---|---|---|
| CN | 107611021 A | 1/2018 |
| KR | 20140140207 A | 12/2014 |

* cited by examiner

*Primary Examiner* — Daniel Whalen
(74) *Attorney, Agent, or Firm* — SZDC Law PC

(57) ABSTRACT

The invention provides a high-resolution QD pixelated light-emitting film and method for preparing same. The method includes: spin-coating a photoresist on a base; drying and exposing the base; coating a developer at a preset position on the base to obtain a photoresist pattern layer; depositing an insulating layer on the photoresist pattern layer by using silane; removing a photoresist pattern in the insulating layer; spin-coating a polyethylenimine solution on the insulating layer to obtain a PEI layer; and dropping a QD solution on the PEI layer to deposit a QD layer. The hydrophobicity of silane is used to implement dewetting to implement QD pixilation. A PEI solution is spontaneously deposited at the position of a photoresist pattern. Further, the QD solution is adsorbed into the PEI solution to obtain a high-resolution QD pixelated light-emitting film, thereby improving the film forming quality, and passivating surface defects of a QD layer.

10 Claims, 4 Drawing Sheets

PEI   N-QDs   Photoresist   De-wetting layer   QD patterns a) Photoresist patterns b) Assembling the de-wetting layer c) Removing photoresist patterns f) QD patterns e) Deposited QD d) Self-assembled electroabsorption layer

METHOD FOR PREPARING HIGH-RESOLUTION QUANTUM DOT (QD) PIXELATED LIGHT-EMITTING FILM

This application is a Continuation Application of PCT/CN2023/098825, filed on Jun. 7, 2023, which claims priority to Chinese Patent Application No. 202310558024.8, filed on May 17, 2023, which is incorporated by reference for all purposes as if fully set forth herein.

FIELD OF THE INVENTION

The present invention relates to the field of quantum dot (QD) technologies, and in particular, to a high-resolution QD pixelated light-emitting film and a method for preparing the same and a transparent QD light-emitting diode and a method for preparing the same.

DESCRIPTION OF THE RELATED ART

A resolution enables a display to vividly present an image, and is a highly critical parameter. As a head-mounted electronic device used for virtual reality (VR), augmented reality (AR), and mixed reality (MR) emerges, the demand for bright and high-resolution electroluminescent (EL) devices is already very urgent. As one of the technologies, AR is the ingenious fusion of virtual information and the real world, so that the content of the real world is effectively reflected, and the display of the content of the virtual information is further facilitated. Such content is subtle and overlaps each other. In visual AR, a user requires the prompt of the superimposition of the real world and computer graphics on the basis of helmet display, and the user can completely see the surrounding real world after superimposition. Therefore, a near-eye display that has high-resolution pixels and can present transparency is very important for the implementation of AR and artificial intelligence. Due to costs and inherent defects of materials, a liquid-crystal display and an organic light-emitting diode (OLED) face very large obstacles in implementing the high-resolution aspect of the near-eye display. QDs have excellent characteristics of a narrow half-peak width and a wide color gamut, and is recognized as a favorable competitor in future light-emitting display materials. Pixelation is an important step of introducing QDs into display, anti-counterfeiting, and optical chip applications. In addition, red (R), green (G), and blue (B) micron/submicron pixels prepared using QDs have the advantage of providing bright and vivid immersive content images within a near-eye watching distance without visual discomfort, and therefore becomes an important leading edge in the display field.

At present, methods for patterning a QD light-emitting film mainly include nanoimprint transfer, ink-jet printing, photolithography, and the like. However, there are still technological obstacles in pattern transfer and alignment using a nanoimprint transfer technique, the scalability and maturity of large-scale production are insufficient, and the technique is still restricted to laboratory-scale demonstrations. Ink-jet printing is a widely researched and promising method, and can manufacture a patterned QD light-emitting film having a normal light-emitting structure. However, due to instable drying kinetics, there are still problems in the resolution and thickness uniformity aspects. In recent years, with the development of semiconductor technologies and the development and application of national photolithography devices, thanks to advantages of large scale and quick manufacturing of QD patterns, photolithography techniques already become research hotspots in the field of high-resolution displays and have drawn close attention of research institutes home and abroad. With the development of QD patterning techniques using photolithography techniques, researches show that photolithography techniques have clear advantages in the aspect of implementing ultra-high-resolution QDs. For example, micron to submicron patterns can be formed in a large area in a required substrate, patterns can be simultaneously defined in a large area of a panel, and patterns irradiated by ultraviolet are prepared only by using light rays diffracted from edges of a pattern photomask, thereby providing extremely high pattern quality. It should be noted that QDs are formed by a limited quantity of atoms, have very large surface energy, and have the problem of chemical, optical or thermal instability. Therefore, the problems of an easily degradable structure and instable optical performance of QDs are main challenges in integration into a high-resolution display and imaging sensor system device array. QDs require solution treatment, and an organic light-emitting body used in an OLED may be patterned through thermal evaporation. A photolithographable polymer layer, that is, a photoresist, is used in a conventional photolithography technique, is coated on a QD film as a photomask layer, and is then patterned through development. However, solution treatment used for photolithography deposition and development may damage a bottom QD layer. In addition, to obtain a full-color RGB image, a photolithography process at least needs to be performed three times. This causes inevitable damage to a QD layer with a pattern. A damaged pattern affects the light-emitting performance of a device, or even hinders full presentation of a display image. As can be seen, the use of a conventional photoresist to perform pattern manufacturing causes destructive damage to QDs.

In summary, in an existing method for preparing a patterned QD light-emitting film, solutions used for photolithography deposition and development need to be used on a QD layer and cause damage to the QD layer. This affects the light-emitting performance of a device and makes it impossible to fully present a display pattern.

SUMMARY OF THE INVENTION

For this, a technical problem to be resolved by the present invention is to overcome the problem in the prior art that in a method for preparing a patterned QD light-emitting film, solutions used for photolithography deposition and development need to be used on a QD layer and cause damage to the QD layer.

To resolve the foregoing technical problems, the present invention provides a method for preparing a high-resolution QD pixelated light-emitting film, including:
  spin-coating a photoresist on a surface of a base;
  drying the base spin-coated with the photoresist;
  exposing the dried base by using a photolithography device;
  coating a developer at a preset position on the surface of the base for development to obtain a photoresist pattern layer;
  depositing a perfluorooctyltrichlorosilane (PFTS) insulating layer on a surface of the photoresist pattern layer by using self-assembly of silane;
  removing a photoresist pattern in the PFTS insulating layer to obtain a PFTS insulating layer having a mesh pattern;

spin-coating a polyethylenimine (PEI) solution on a surface of the PFTS insulating layer having a mesh pattern to obtain a PEI layer; and dropping a QD solution on a surface of the PEI layer to deposit a QD layer to obtain a high-resolution QD pixelated light-emitting film.

In an embodiment of the present invention, before the spin-coating a photoresist on a surface of a base, the method further includes:

washing the base using acetone and isopropanol sequentially; and drying the washed base by placing the it on a heating platformg.

In an embodiment of the present invention, after the dropping a QD solution on a surface of the PEI layer to deposit a QD layer to obtain a high-resolution QD pixelated light-emitting film, the method further includes: detecting element distribution on a surface of the high-resolution QD pixelated light-emitting film by using an energy dispersion spectrometer (EDS) in a scanning electron microscope (SEM).

In an embodiment of the present invention, the base is transparent conductive film glass or a silicon wafer.

In an embodiment of the present invention, a shape of the photoresist pattern includes, but not limited to, a circle, a square, and a hexagon.

In an example of the present invention, the PEI solution is a PEI aqueous solution.

The present invention further provides a high-resolution QD pixelated light-emitting film. The high-resolution QD pixelated light-emitting film is prepared by using the foregoing method for preparing a high-resolution QD pixelated light-emitting film.

The present invention further provides a method for preparing a transparent QD light-emitting diode, including:

providing a PFTS insulating layer having a mesh pattern prepared by using the foregoing method for preparing a high-resolution QD pixelated light-emitting film;

spin-coating a colloid-doped oxide semiconductor solution on a surface of the PFTS insulating layer having a mesh pattern to obtain an electron transport layer;

spin-coating a PEI solution on a surface of the electron transport layer to obtain a PEI layer;

dropping a QD solution on a surface of the PEI layer to deposit a QD layer;

spin-coating a chlorobenzene solution on a surface of the QD layer to obtain a hole transport layer;

placing a Kapton tape having a preset pattern as a photomask at a first preset position on a surface of the hole transport layer, and coating a silver nanowire on a surface of the photomask to obtain a negative electrode; and placing a Kapton tape having a preset pattern as a photomask at a second preset position on the surface of the hole transport layer, and coating indium tin oxide on a surface of the photomask to obtain a positive electrode.

In an embodiment of the present invention, the PEI solution is a PEI ethanol solution.

The present invention further provides a transparent QD light-emitting diode, where the transparent QD light-emitting diode is prepared by using the foregoing method for preparing a transparent QD light-emitting diode.

The method for preparing a high-resolution QD pixelated light-emitting film provided in the present invention includes: spin-coating a photoresist on a surface of a base, and drying and exposing the base; coating a developer at a preset position on the surface of the base to obtain a photoresist pattern layer; depositing a PFTS insulating layer on a surface of the photoresist pattern layer by using a self-assembly technique with silane; removing a photoresist pattern in the PFTS insulating layer; spin-coating a PEI solution on a surface of the PFTS insulating layer to obtain a PEI layer; and finally, dropping a QD solution on a surface of the PEI layer to deposit a QD layer. In the present invention, the hydrophobicity of silane is utilized to implement dewetting to implement QD pixilation. A PEI solution is further spontaneously deposited at the position of a photoresist pattern by using the hydrophobicity of PFTS. Finally, based on the electrostatic interaction between a QD solution and the PEI solution, the QD solution is spontaneously adsorbed into the PEI solution to obtain a high-resolution QD pixelated light-emitting film. Direct photolithography on a QD layer is avoided, damage to the QD layer by the process is prevented, the film forming quality of the QD layer is improved, and surface defects of the QD layer are passivated.

BRIEF DESCRIPTION OF THE DRAWINGS

To make the content of the present invention clearer and more comprehensible, the present invention is further described in detail below according to specific embodiments of the present invention and the accompanying draws. Where.

Figure 3:
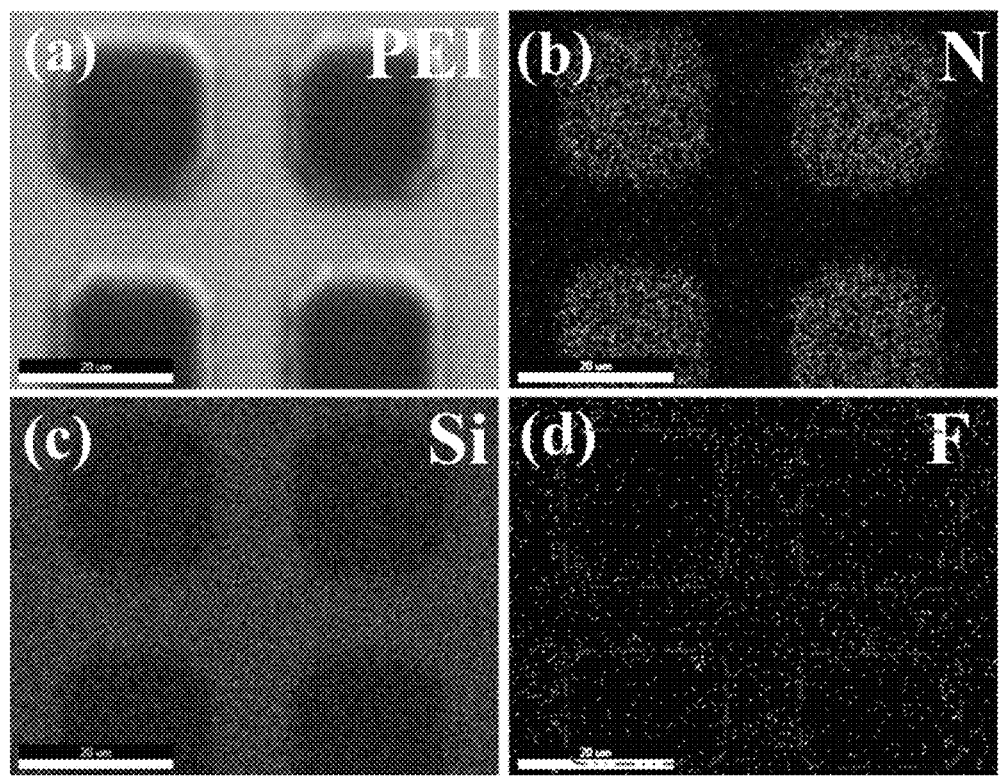
Figure 4:
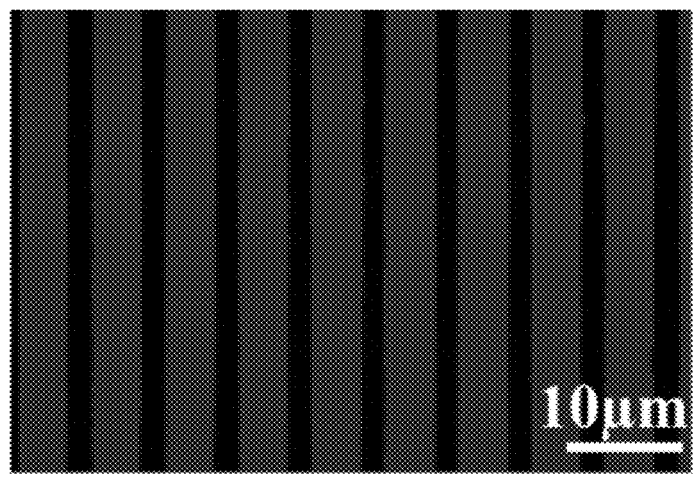
Figure 5:
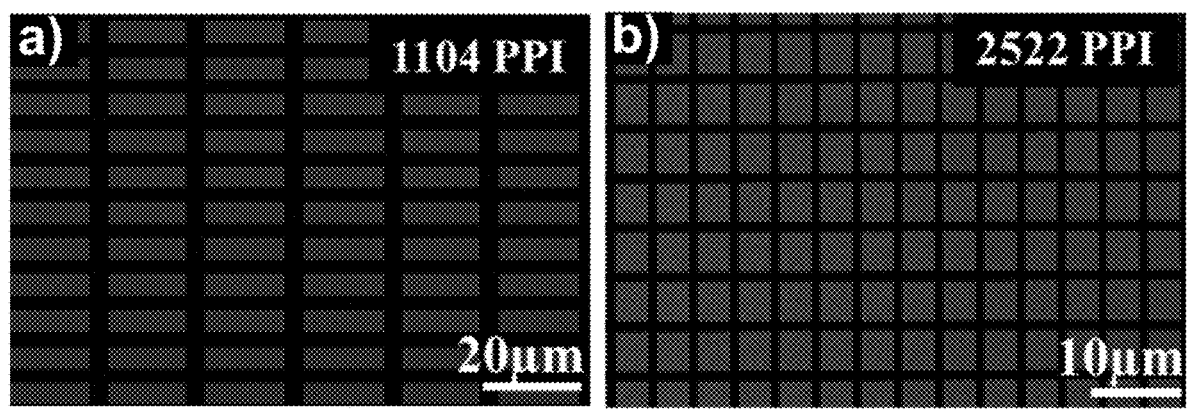
Figure 6:
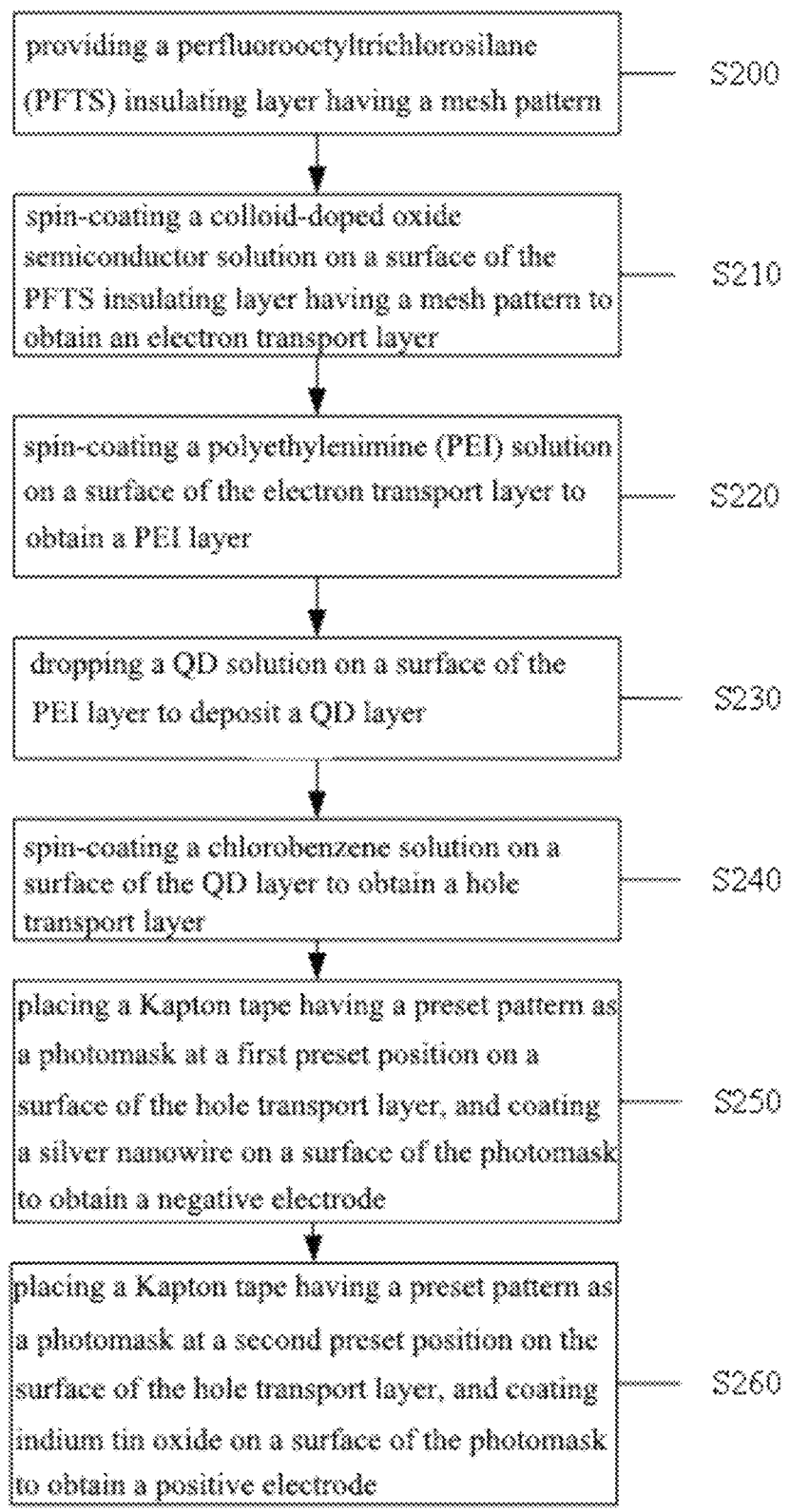

(a) in FIG. 3 is a schematic diagram of a first verification result according to the present invention;

(b) in FIG. 3 is a schematic diagram of a second verification result according to the present invention;

(c) in FIG. 3 is a schematic diagram of a third verification result according to the present invention;

(d) in FIG. 3 is a schematic diagram of a fourth verification result according to the present invention;

FIG. 4 is a fluorescence microscope image of a first high-resolution QD pixelated light-emitting film according to the present invention;

(a) in FIG. 5 is a fluorescence microscope image of a second high-resolution QD pixelated light-emitting film according to the present invention;

(b) in FIG. 5 is a fluorescence microscope image of a third high-resolution QD pixelated light-emitting film according to the present invention; and FIG. 6 is a flowchart of a method for preparing a transparent QD light-emitting diode according to the present invention.

DETAILED DESCRIPTION OF THE PREFERRED EMBODIMENTS

The present invention is further described below with reference to the accompanying drawings and specific embodiments, to enable a person skilled in the art to better understand and implement the present invention. However, the embodiments are not used to limit the present invention.

Embodiment 1

Figure 1:
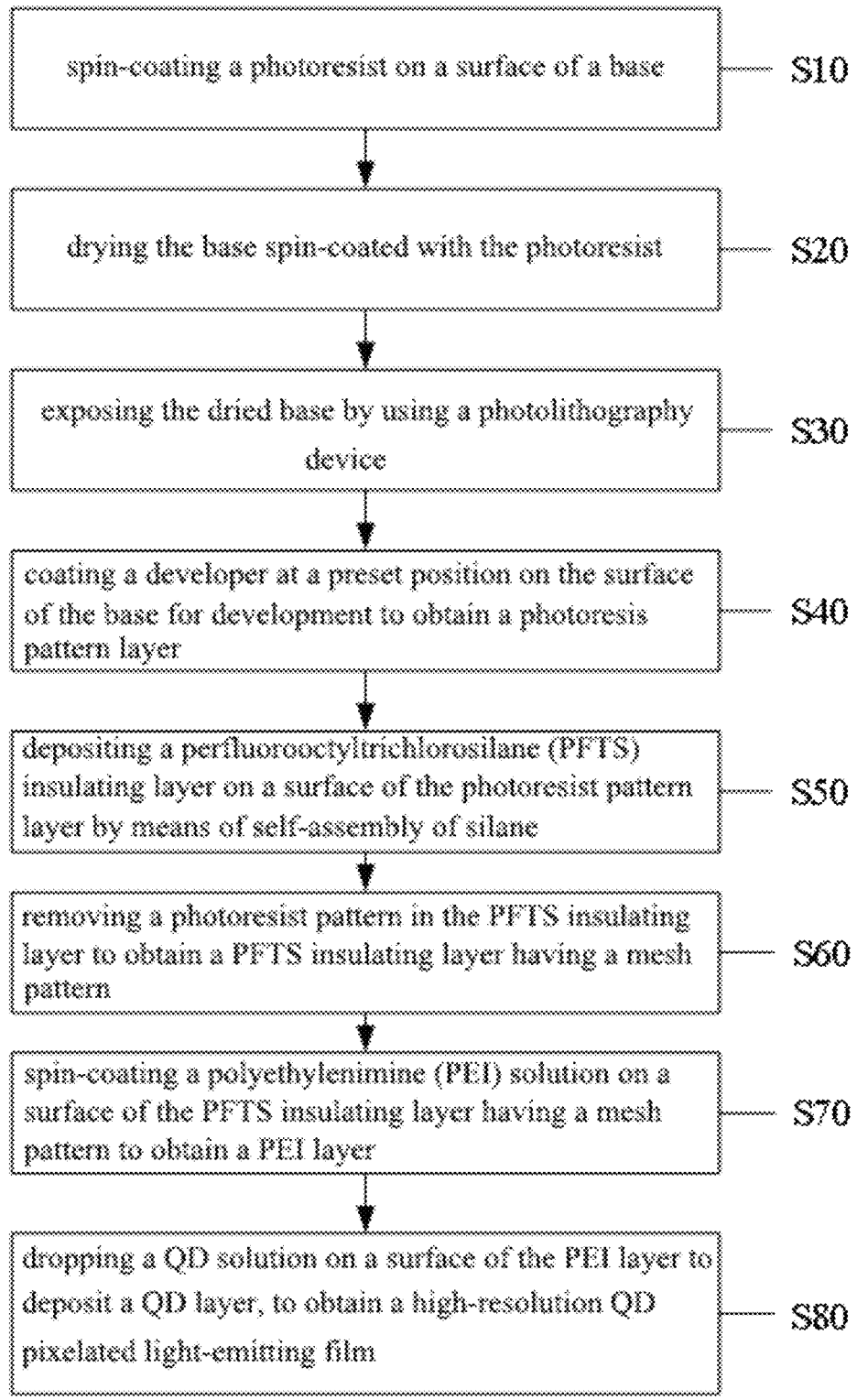
FIG. 1 is a flowchart of a method for preparing a high-resolution QD pixelated light-emitting film according to the present invention.

FIG. 1 is a flowchart of a method for preparing a high-resolution QD pixelated light-emitting film according to the present invention. The method includes:

S10: spin-coating a photoresist on a surface of a base.

Optionally, the base may be transparent conductive film glass or a silicon wafer.

In some embodiments, before step S10, the method further includes: washing the base using acetone and isopropanol sequentially; and drying the washed base by placing the washed base on a heating platform.

For example, the base may be washed sequentially by using acetone or isopropanol. Subsequently, the base is placed on the heating platform, and is dried at 110° C. for 10 minutes, to prevent moisture on the base from affecting a subsequently spin-coated photoresist. After the base is dried and cooled, a photoresist AZ5214 is coated on the entire base, and is spin-coated for 40 seconds at a speed of 3500 rpm.

In other embodiments, during the drying of the base, other temperature and time may be set, to prevent moisture on the surface of the base from affecting the photoresist. Optionally, another photoresist may be coated on the surface of the base. This is not limited in this application.

S20: drying the base spin-coated with the photoresist.

In some embodiments, the specific implementation of step S20 includes: drying the base at 105° C. for 5 minutes, to improve an acting force between the photoresist and the base, thereby preventing the photoresist from falling off in a subsequent development process.

In other embodiments, during the drying of the base, other temperature and time may be set. This is not limited in this application.

S30: exposing the dried base by using a photolithography device.

In this embodiment, the used photolithography device is ARM/6/350/NUV/DCCD/BSV/M, USA. In other embodiments, a photolithography device of another model may be used. This is not limited in this application.

Figure 2:
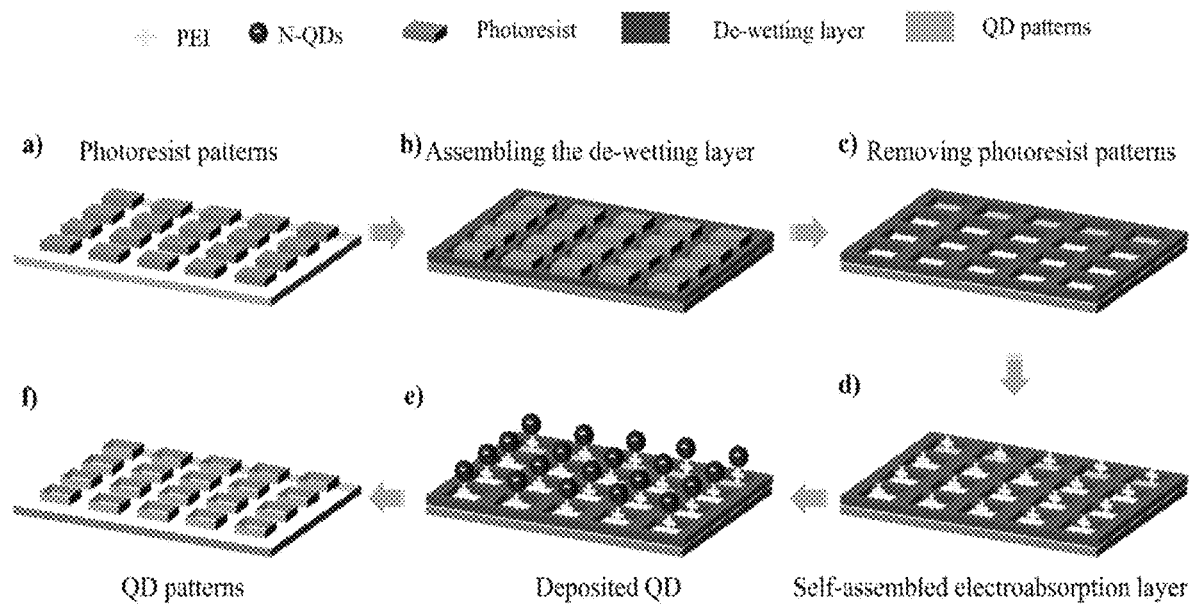
FIG. 2 is a schematic flowchart of preparing a high-resolution QD pixelated light-emitting film according to the present invention.

S40: coating a developer at a preset position on the surface of the base for development to obtain a photoresist pattern layer, as shown in (a) in FIG. 2.

Optionally, a shape of a pattern on the photoresist pattern layer may be a circle, a square, a hexagon, or the like.

In this embodiment, the used developer is AZ400K. In other embodiments, another developer may be used. This is not limited in this application.

S50: depositing a PFTS insulating layer on a surface of the photoresist pattern layer by using a self-assembly technique with silane, as shown in (b) in FIG. 2.

Optionally, the silane may be fluoroalkyl silane or another hydrophobic functional silane. The reason is that the hydrophobicity of silane may be utilized to implement a dewetting effect to implement QD pixelation, the silane is used as an insulating layer, and may further be used in a subsequent alternating process of a PEI solution and a photoresist pattern.

S60: removing a photoresist pattern in the PFTS insulating layer to obtain a PFTS insulating layer having a mesh pattern, as shown in (c) in FIG. 2.

S70: Spin-coat a PEI solution on a surface of the PFTS insulating layer having a mesh pattern to obtain a PEI layer.

After the PEI solution is spin-coated on the surface of the PFTS insulating layer, due to the hydrophobicity of PFTS, the PEI solution is spontaneously deposited in a hydrophilic region, that is, an initial photoresist pattern region, as shown in (d) in FIG. 2.

Specifically, a PEI aqueous solution is used as the PEI solution in this embodiment.

S80: dropping a QD solution on a surface of the PEI layer to deposit a QD layer to obtain a high-resolution QD pixelated light-emitting film.

Due to the electrostatic interaction between the QD solution and the PEI solution, the QD solution is spontaneously adsorbed into the PEI solution, that is, the initial photoresist pattern region, as shown in (e) in FIG. 2, and finally the high-resolution QD pixelated light-emitting film is obtained, as shown in (f) in FIG. 2.

In the method for preparing a high-resolution QD pixelated light-emitting film provided in this embodiment, a hydrophobic silane deposition insulating layer is used to form a dewetting layer, and the electrostatic interaction between PEI solution and the QD solution is utilized to form an electric adsorption layer. Due to different free energy on the surface of the layer, QDs have undergone dewetting, and deposition is selectively performed to construct a pattern. The method does not require photolithography on the QD layer, so that deposition and development solutions in the process are prevented from causing damage to the QD layer, thereby improving the film forming quality of the QD layer and passivating surface defects of the QD layer.

To verify the foregoing solution, in this embodiment, after the high-resolution QD pixelated light-emitting film is obtained, a built-in EDS of a SEM is further used to detect element distribution on the surface of the finally obtained high-resolution QD pixelated light-emitting film. Detection results are as follows:

As shown in (a) and (b) in FIG. 3, N element signals mainly gather in the initial photoresist pattern region, and nearly no N element signal exists in other regions. As can be learned, based on the hydrophobicity of the PFTS insulating layer, the PEI solution mainly gather in the initial photoresist pattern region to form the electric adsorption layer.

As shown by (c) and (d) in FIG. 3, Si element signals are present in a peripheral region of an initial photoresist pattern, and as can be seen from the distribution of F element signals, the PFTS insulating layer is mainly distributed in the peripheral region of the photoresist pattern to form the dewetting layer.

A mesh arrangement in which the dewetting layer and the electric adsorption layer are intersected and separated may facilitate the adsorption of the QD solution to a required region to obtain the high-resolution QD pixelated light-emitting film, thereby implementing pixelation.

For example, based on the foregoing embodiment and detection results, the embodiments of this application further provide three high-resolution QD pixelated light-emitting films prepared by using the method. FIG. 4 shows a high-resolution QD pixelated light-emitting film having a line pattern with a line width of 5 μm provided in this embodiment. (a) in FIG. 5 shows a high-resolution QD pixelated light-emitting film having a rectangular pattern with a resolution of 1104 PPI provided in this embodiment. (b) in FIG. 5 shows a high-resolution QD pixelated light-emitting film having a square pattern with a resolution of 2522 PPI provided in this embodiment.

In addition, in other embodiments, a sphalerite (CdSe) QD pattern with a minimum size of 5 μm×5 μm is further manufactured based on the foregoing preparation method, and the resolution of the pattern exceeds 2522 PPI.

Based on the foregoing Embodiment 1, this application further provides a high-resolution QD pixelated light-emitting film. The high-resolution QD pixelated light-emitting film is obtained by using the foregoing method for preparing a high-resolution QD pixelated light-emitting film.

Embodiment 2

Based on the foregoing Embodiment 1, this embodiment of this application further provides a method for preparing a transparent QD light-emitting diode. FIG. 6 is a flowchart of a method for preparing a transparent QD light-emitting diode. The method includes:

S200: providing a PFTS insulating layer having a mesh pattern prepared by using the foregoing preparation method in Embodiment 1.

S210: spin-coating a colloid-doped oxide semiconductor solution on a surface of the PFTS insulating layer having a mesh pattern to obtain an electron transport layer.

In this embodiment, the specific implementation of step S210 includes: spin-coating the colloid-doped oxide semiconductor solution on the surface of the PFTS insulating layer having a mesh pattern for 40 seconds at a speed of 2000 rpm to obtain the electron transport layer, and placing the base on a heating plate at 100° C. to perform annealing for 20 minutes.

For example, the colloid-doped oxide semiconductor solution in this embodiment is a colloid Mg-doped ZnO nanocrystal solution. Optionally, in other embodiments, another solution may be used. This is not limited in this application.

S220: spin-coating a PEI solution on a surface of the electron transport layer to obtain a PEI layer.

Specifically, the PEI solution in this embodiment is a PEI ethanol solution.

Optionally, in other embodiments, the concentration of the PEI solution may be adjusted as required, to obtain a PEI layer of different thickness.

S230: dropping a QD solution on a surface of the PEI layer to deposit a QD layer.

In this embodiment, a specific implementation of step S230 includes: dropping the QD solution on the surface of the PEI layer to deposit the QD layer, and drying the base at 60° C. for several minutes to dry the QD layer.

S240: spin-coating a chlorobenzene solution on a surface of the QD layer to obtain a hole transport layer.

In this embodiment, a specific implementation of step S260 includes: spin-coating a chlorobenzene solution with a concentration of 8 mg/ml on the surface of the QD layer at a speed of 2000 rpm for 40 seconds to obtain the hole transport layer, and annealing the base at 120° C. for 15 minutes to obtain a light-emitting layer of the transparent QD light-emitting diode.

S250: placing a Kapton tape having a preset pattern as a photomask at a first preset position on a surface of the hole transport layer, and coating a silver nanowire (AgNWs) on a surface of the photomask to obtain a negative electrode.

Specifically, an isopropanol solution with a concentration of 8 mg/ml is used for the silver nanowire in this embodiment.

Optionally, a preset pattern on the Kapton tape may be laser-carved as required.

S260: placing a Kapton tape having a preset pattern as a photomask at a second preset position on the surface of the hole transport layer, and coating indium tin oxide (ITO) on a surface of the photomask to obtain a positive electrode.

A transparent electrode manufactured by using ITO and AgNWs in this embodiment of this application has both high conductivity and high visible light transmittance, so that the light transmittance of the transparent QD light-emitting diode can be improved.

Based on the foregoing embodiments, this application further provides a transparent QD light-emitting diode, where the transparent QD light-emitting diode is obtained by using the foregoing method for preparing a transparent QD light-emitting diode.

In this embodiment, an intersection of a positive electrode and a negative electrode is further used to define that an effective area of a single transparent QD light-emitting diode is 1 mm*1 mm, to facilitate detection and measurement.

In the transparent QD light-emitting diode provided in this embodiment, a high-precision QD pattern is accurately adjusted by using a PEI layer. When a PFTS insulating layer is used as a barrier layer, a huge leakage current between charge carrier transport layers is inhibited, thereby improving the performance of the transparent QD light-emitting diode. In addition, the transparent QD light-emitting diode manufactured by using this method has a resolution from 1104 PPI to 3031 PPI, the efficiency is up to 15.6%, and the size of the diode can be significantly reduced, to generate an LED pixel array with a high density. In addition, the transparent QD light-emitting diode has light transmittance up to 90.7% and has high efficiency and high light transmittance. Therefore, the diode will be hopefully used in AR display technologies and vehicle head-up display devices in the future.

Obviously, the foregoing embodiments are merely examples for clear description, rather than a limitation to implementations. For a person of ordinary skill in the art, other changes or variations in different forms may also be made based on the foregoing description. All implementations cannot and do not need to be exhaustively listed herein. Obvious changes or variations that are derived there from still fall within the protection scope of the invention of the present invention.

What is claimed is:

1. A method for preparing a high-resolution quantum dot (QD) pixelated light-emitting film, comprising:
    spin-coating a photoresist on a surface of a base;
    drying the base spin-coated with the photoresist;
    exposing the dried base by using a photolithography device;
    coating a developer at a preset position on the surface of the base for development to obtain a photoresist pattern layer;
    depositing a perfluorooctyltrichlorosilane (PFTS) insulating layer on a surface of the photoresist pattern layer by means of self-assembly of silane;
    removing a photoresist pattern in the PFTS insulating layer to obtain a PFTS insulating layer having a mesh pattern;
    spin-coating a polyethylenimine (PEI) solution on a surface of the PFTS insulating layer having the mesh pattern to obtain a PEI layer; and
    dropping the QD solution on a surface of the PEI layer to deposit a QD layer, to obtain the high-resolution QD pixelated light-emitting film.

2. The method for preparing the high-resolution QD pixelated light-emitting film according to claim 1, wherein before spin-coating the photoresist on the surface of the base, the method further comprises:
    washing the base using acetone and isopropanol sequentially; and
    drying the washed base by placing it on a heating platform.

3. The method for preparing the high-resolution QD pixelated light-emitting film according to claim 1, wherein after dropping the QD solution on the surface of the PEI layer to deposit the QD layer to obtain the high-resolution QD pixelated light-emitting film, the method further comprises: detecting element distribution on a surface of the high-resolution QD pixelated light-emitting film by using an energy dispersion spectrometer (EDS) in a scanning electron microscope (SEM).

4. The method for preparing the high-resolution QD pixelated light-emitting film according to claim 1, wherein the base is transparent conductive film glass or a silicon wafer.

5. The method for preparing the high-resolution QD pixelated light-emitting film according to claim 1, wherein a shape of the photoresist pattern comprises, but not limited to, a circle, a square, and a hexagon.

6. The method for preparing the high-resolution QD pixelated light-emitting film according to claim 1, wherein the PEI solution is a PEI aqueous solution.

7. The high-resolution quantum dot (QD) pixelated light-emitting film, wherein the high-resolution QD pixelated light-emitting film is prepared by using the method according to claim 1.

8. A method for preparing a transparent quantum dot (QD) light-emitting diode, comprising:

providing the perfluorooctyltrichlorosilane (PFTS) insulating layer having the mesh pattern prepared by using the method according to claim 1;

spin-coating a colloid-doped oxide semiconductor solution on a surface of the PFTS insulating layer having the mesh pattern to obtain an electron transport layer;

spin-coating a polyethylenimine (PEI) solution on a surface of the electron transport layer to obtain a PEI layer;

dropping a QD solution on a surface of the PEI layer to deposit a QD layer;

spin-coating a chlorobenzene solution on a surface of the QD layer to obtain a hole transport layer;

placing a Kapton tape having a preset pattern as a photomask at a first preset position on a surface of the hole transport layer, and coating a silver nanowire on a surface of the photomask to obtain a negative electrode; and placing a Kapton tape having a preset pattern as a photomask at a second preset position on the surface of the hole transport layer, and coating indium tin oxide on a surface of the photomask to obtain a positive electrode.

9. The method for preparing the transparent QD light-emitting diode according to claim 8, wherein the PEI solution is a PEI ethanol solution.

10. The transparent quantum dot (QD) light-emitting diode, wherein the transparent QD light-emitting diode is prepared by using the method according to claim 8.

\* \* \* \* \*